(12) United States Patent
Hass

(10) Patent No.: US 7,713,066 B2
(45) Date of Patent: May 11, 2010

(54) CARD EDGE CONNECTOR DEVICE AND METHOD

(75) Inventor: Kenneth Hass, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 146 days.

(21) Appl. No.: 12/072,145

(22) Filed: Feb. 25, 2008

(65) Prior Publication Data

US 2009/0215318 A1    Aug. 27, 2009

(51) Int. Cl.
*H01R 12/00* (2006.01)
(52) U.S. Cl. .................... 439/62; 439/607.01; 439/327
(58) Field of Classification Search ................. 439/327, 439/607.01, 62
See application file for complete search history.

(56) References Cited

U.S. PATENT DOCUMENTS

| | | | | |
|---|---|---|---|---|
| 5,197,887 | A | * | 3/1993 | Davidge et al. ............... 439/60 |
| 6,116,949 | A | * | 9/2000 | Costello et al. ............ 439/509 |
| 7,147,476 | B1 | * | 12/2006 | Chang et al. .................. 439/62 |
| 7,310,237 | B2 | * | 12/2007 | McEwan et al. ............ 361/759 |

* cited by examiner

*Primary Examiner*—Tho D Ta
(74) *Attorney, Agent, or Firm*—Suiter Swantz pc llo

(57) ABSTRACT

A device may include a card including a card connector and/or a card edge lockshield disposed on at least a card connector first side. Additionally, a computer system may include a motherboard including at least one mating connector and/or at Least one card including a card connector and a card edge lockshield disposed on at least a card connector first side. Further, a method for providing the device and/or computer system is disclosed.

10 Claims, 5 Drawing Sheets

CARD EDGE CONNECTOR DEVICE AND METHOD

TECHNICAL FIELD

The present disclosure generally relates to the field of computer systems and configurations, and more particularly to a device and method for providing a card edge lockshield.

BACKGROUND

Many computer storage enclosures, such as a blade server, utilize multiple drives and removable components. A blade server and/or a computer server may include a housing for a number of drives, individual minimally-packaged computer motherboard blades, and/or other computer components. A drive and/or blade may include one or more processors, memory, storage, and/or network connections, but may share a common power supply and common air-cooling resource associated with a chassis of the server. A server may have certain components removed for space and power consideration while still being functional as a computer. A blade server may allow more processing power in less rack space, simplified cabling, and reduced power consumption. These computer components may be coupled with a motherboard by utilizing a computer bus for attaching peripheral devices to the computer motherboard.

SUMMARY

A device may include a card including a card connector and/or a card edge lockshield disposed on at least a card connector first side.

A computer system may include a motherboard including at least one mating connector, and/or at least one card including a card connector and a card edge lockshield disposed on at least a card connector first side.

A method may include providing a card including a card connector and/or attaching a card edge lockshield to a card connector first side.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
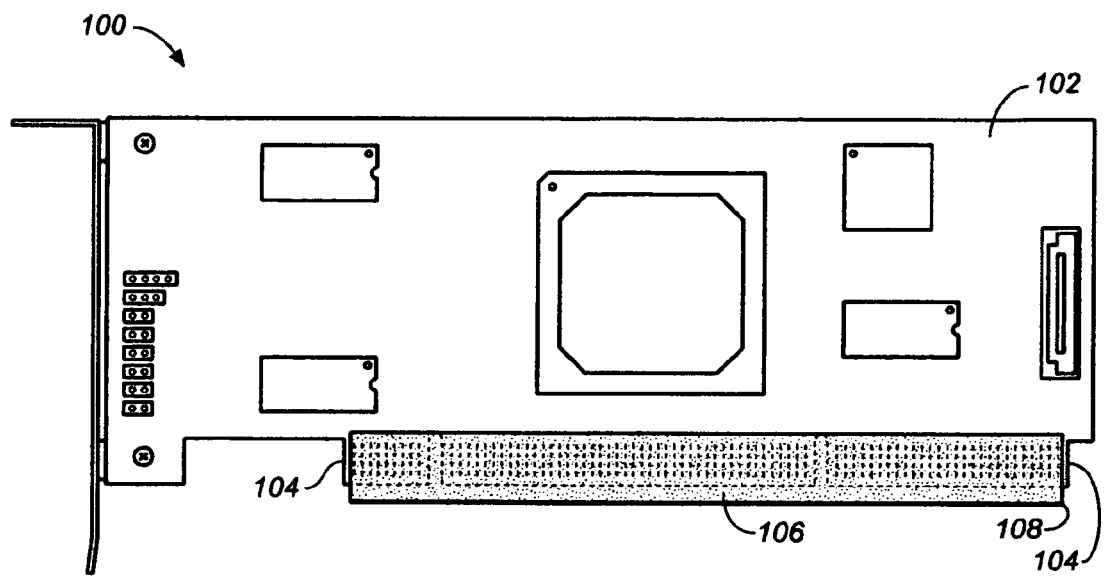
FIG. 1 is a side elevational view illustrating a device utilizing a card edge lockshield.

Reference will now be made in detail to the subject matter disclosed, which is illustrated in the accompanying drawings.

Referring generally to FIGS. 1 through 7, a device 100, a computer system 200 utilizing a device 100, and a method for providing a device 100 and/or computer system 200 utilizing a device 100 are described. The device 100 may include a card 102, a card connector 104, and/or a card edge lockshield 106. The computer system 200 may include a motherboard 202 and at least one mating connector 204 having a mating indentation 206.

A device 100 may include a card 102, a card connector 104, and/or a card edge lockshield 106. A card 102 may include any computer expansion card. For example, a computer expansion card may include a graphics card, a sound card, a network card, a modem, a host adapter, such as a SCSI and/or a RAID controller, a modem, a physics card, and/or an interface adapter card. A card connector 104 may include any card extension having conductive pads and/or contact pins configured for coupling with a card socket and/or an expansion slot. In one example, a card connector 104 includes a host adapter having a lip with multiple conductive pads and is configured for coupling with a PCI-X socket. In another example, a card 102 includes a zero channel RAID (ZCR) controller card. A card socket may include any expansion slot, such as an accelerated graphics port (AGP), a peripheral component interconnect (PCI), a peripheral component interconnect extended (PCI-X), a peripheral component interconnect express (PCIe), etc.

A card edge lockshield 106 may include a flexible strip of material extending the length of both sides of the card connector 104 and extending past the bottom edge of the card connector 104. The card edge lockshield 106 may include a substantially flexible strip comprising a plastic, a polymer, and/or other materials configured to be substantially flexible and protective of the card connector 104. Further, the card edge lockshield 106 may include an electrostatic discharge shield. An electrostatic discharge shield may include any material having a property where undesirable electric current is blocked and/or shielded. The card edge lockshield 106 edge extending past the bottom edge of the card connector 104 may include a hard edge 108 configured for coupling with a mating indentation 206 disposed on a mating connector 204. When card connector 104 is inserted into and/or coupled with an expansion slot portion of a mating connector 204, the hard edge 108 may snap into and/or otherwise connect with a mating indentation 206 on the mating connector 204. A user may insert and apply pressure on a top edge of the base card of the device 100, and the card edge lockshield 106 may snap and/or click into mating indentation 206 as the card connector 104 is coupled with the mating connector 204. In order to release the card connector 104 from the mating connector 204 and the card edge lockshield 106 from the mating indentation 206, a user may pull the device 100 away from the mating connector 204 causing the flexible card edge lockshield 106 to release from the mating indentation 206 and the device 100 to release from the mating connector 204. For example, the hard edge 108 may include at least a partially cylindrical shaped edge adapted to couple with a corresponding at least partial cylindrical indentation disposed on a mating connector 204. In another example, the hard edge 108 may include a card edge lockshield 106 extending past a card connector 104 edge with a 90° turn in the card edge lockshield 106 toward the card connector 104 resulting in a portion of the end of the card edge lockshield 106 being adapted to couple with a groove indentation disposed on a mating connector 204. In one instance, a device 100 includes a RAID controller card having a card connector configured for coupling with a mating connector including a PCI expansion slot and a card edge lockshield extending past the card connector edge and having a hard edge including a partial cylindrical shaped edge configured for coupling with a partial cylindrical mating indentation disposed on the mating connector.

The computer system 200 may include a motherboard 202, at least one mating connector 204, and a mating indentation 206. A motherboard 202 may include any central and/or primary circuit board making up a complex electronic system and/or computer. Additionally, a motherboard 202 may provide at least one electrical connection which other components of the system may communicate through, a central processing unit, and other subsystems, such as some peripheral interfaces. A mating connector 204 may include a computer bus for attaching peripheral devices to a computer motherboard, such as an expansion slot. Some examples of an expansion slot and/or expansion slot standards may include PCI, PCI Express, PCI-X, AGP, and/or PCI-Express 1X. A mating indentation 206 may include any cavity, groove, notch, recess, concavity, indentation, and/or other connection means configured for coupling with a hard edge 108 disposed on a card edge lockshield 106 as discussed in previous paragraphs. In one instance, a computer system includes a motherboard, multiple mating connectors including a PCI-X expansion slot, a mating indentation disposed on the PCI-X expansion slot in the form of a partially cylindrical groove configured for coupling with a corresponding partially cylindrical card edge lockshield 106 hard edge 108, and a device 100.

Figure 4:
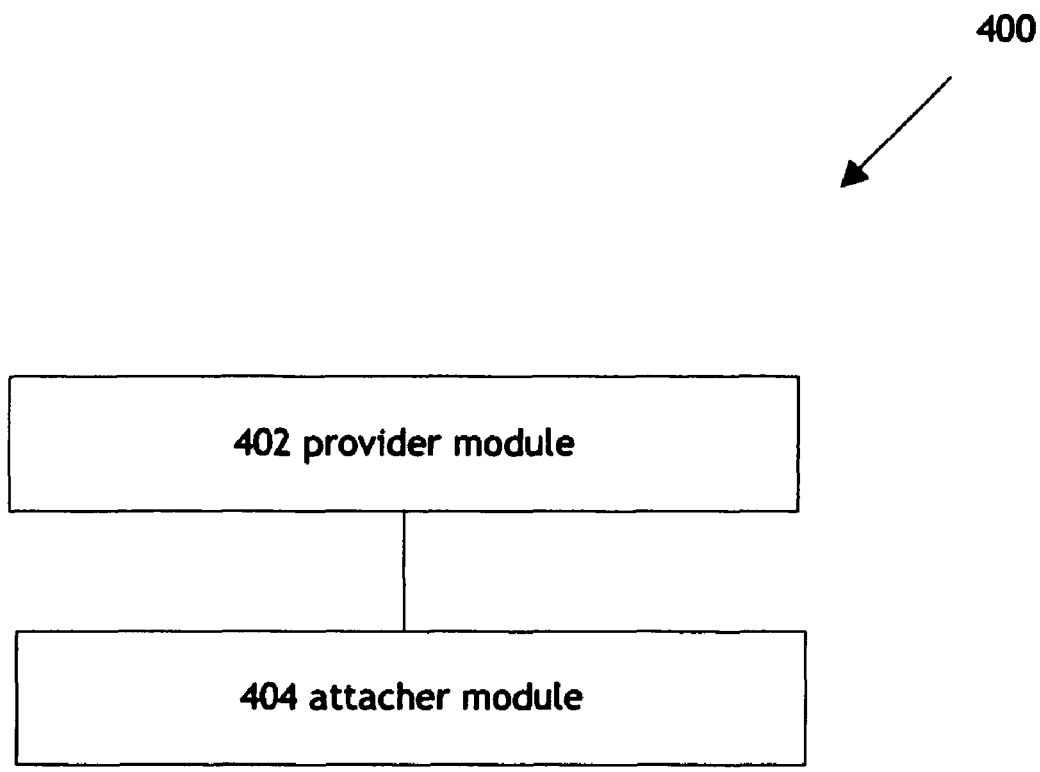
FIG. 4 illustrates an exemplary environment in which one or more technologies may be implemented.

Referring to FIG. 4, a system 400 is illustrated for providing a card including a card connector and/or attaching a card edge lockshield to a card connector first side and a card connector second side where the card edge lockshield includes a flexible plastic protective strip, the card edge lockshield includes a hard edge configured for coupling to a mating indentation disposed on a mating connector, and the card edge lockshield is disposed parallel to the card connector and extends beyond a card connector edge. The system 400 may include provider module 402 and/or attacher module 604. System 400 generally represents instrumentality for providing a card including a card connector and/or attaching a card edge lockshield to a card connector first side and a card connector second side where the card edge lockshield includes a flexible plastic protective strip, the card edge lockshield includes a hard edge configured for coupling to a mating indentation disposed on a mating connector, and the card edge lockshield is disposed parallel to the card connector and extends beyond a card connector edge. The steps of providing a card including a card connector and/or attaching a card edge lockshield to a card connector first side and a card connector second side where the card edge lockshield includes a flexible plastic protective strip, the card edge lockshield includes a hard edge configured for coupling to a mating indentation disposed on a mating connector, and the card edge lockshield is disposed parallel to the card connector and extends beyond a card connector edge may be accomplished electronically (e.g. with a set of interconnected electrical components, an integrated circuit, and/or a computer processor, etc.) and/or mechanically (e.g. an assembly line, a robotic arm, etc.).

Figure 5:
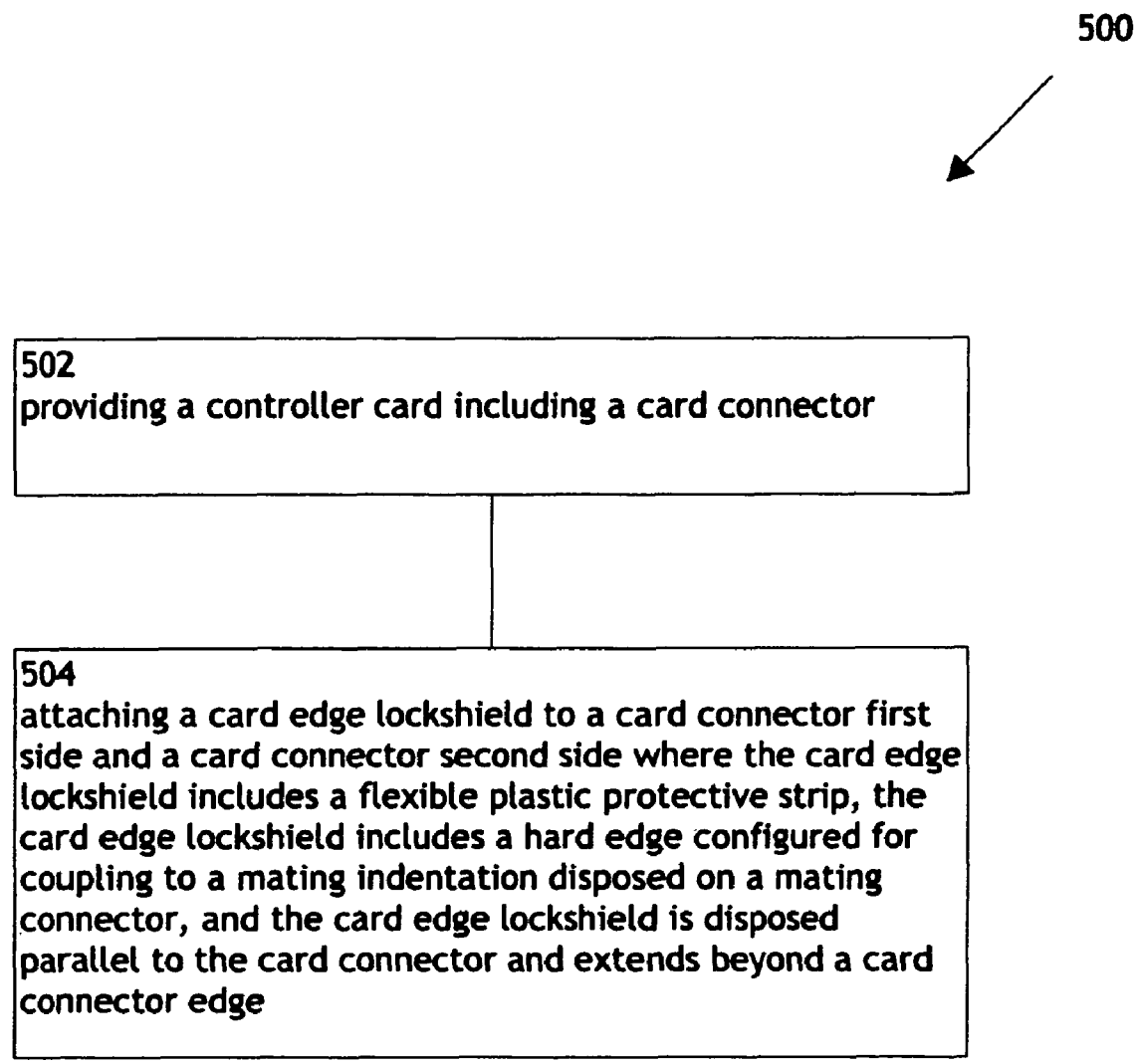
FIG. 5 illustrates an operational flow representing example operations related to providing a card including a card connector and/or attaching a card edge lockshield to a card connector first side.

Referring generally to FIGS. 5 through 7, methods for providing a device 100 and/or a computer system 200 utilizing a card edge lockshield 106 are disclosed. FIG. 5 illustrates an operational flow 500 representing example operations related to providing a card including a card connector and/or attaching a card edge lockshield to a card connector first side are disclosed. In FIG. 5 and in following figures that include various examples of operational flows, discussion and explanation may be provided with respect to the above-described examples of FIGS. 1 through 4, and/or with respect to other examples and contexts. However, it should be understood that the operational flows may be executed in a number of other environments and contexts, and/or in modified versions of FIGS. 1 through 7. Also, although the various operational flows are presented in the sequence(s) illustrated, it should be understood that the various operations may be performed in other orders than those which are illustrated, or may be performed concurrently.

After a start operation, the operational flow 500 moves to a providing operation 502, where providing a card including a card connector may occur. For example, as generally shown in FIGS. 1 through 4, provider module 402 may provide a card 102 including a card connector 104. Providing operation 502 may be conducted in an automated fashion such as, for example, by an automated provider module 402 (e.g. a robotic arm and/or automated production line configured to provide a card 102 including a card connector 104) such as those commonly found in the manufacturing arts, may be employed.

Figure 2:
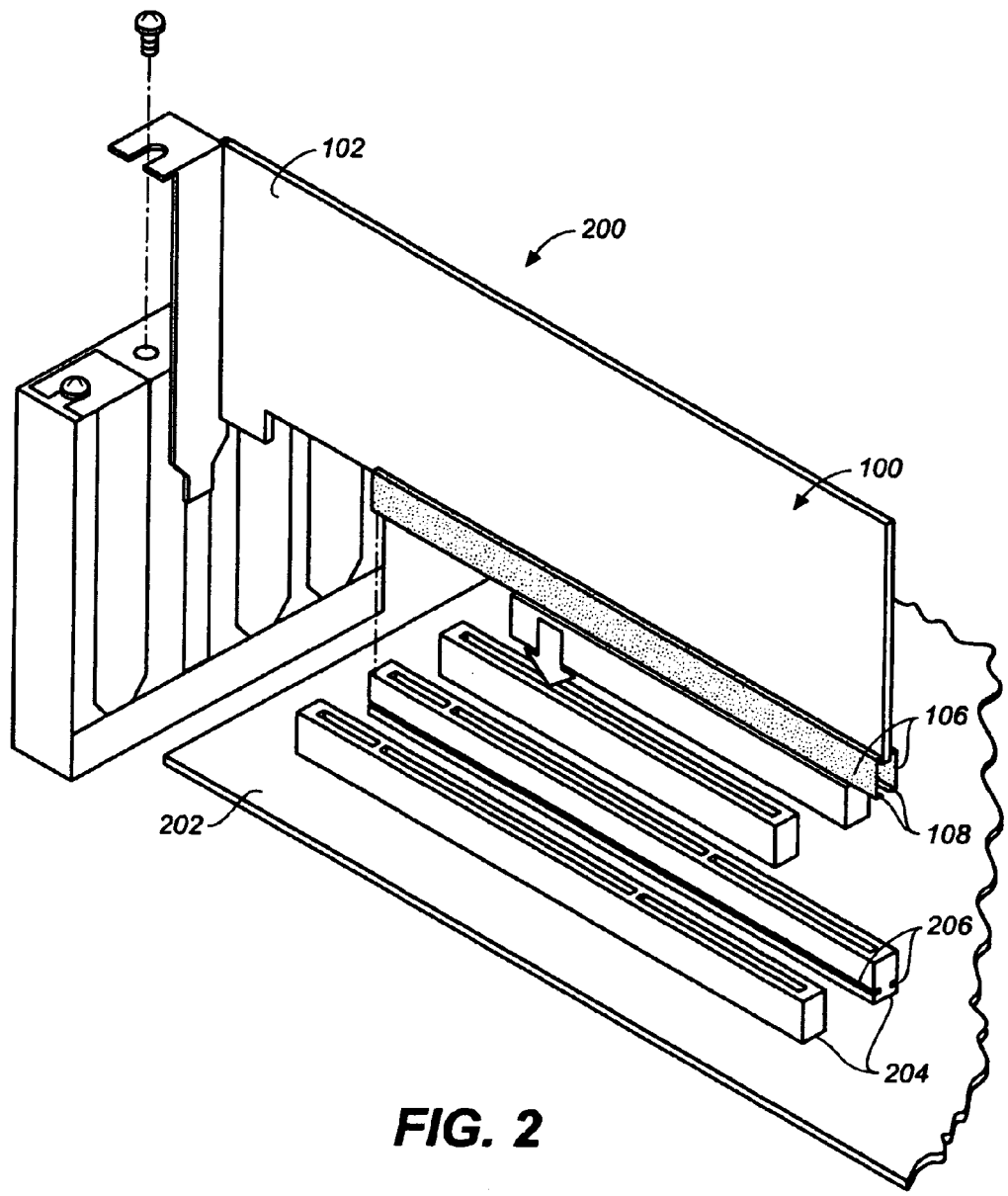
FIG. 2 is an isometric view illustrating a computer system utilizing a device having a card edge lockshield.
Figure 3:
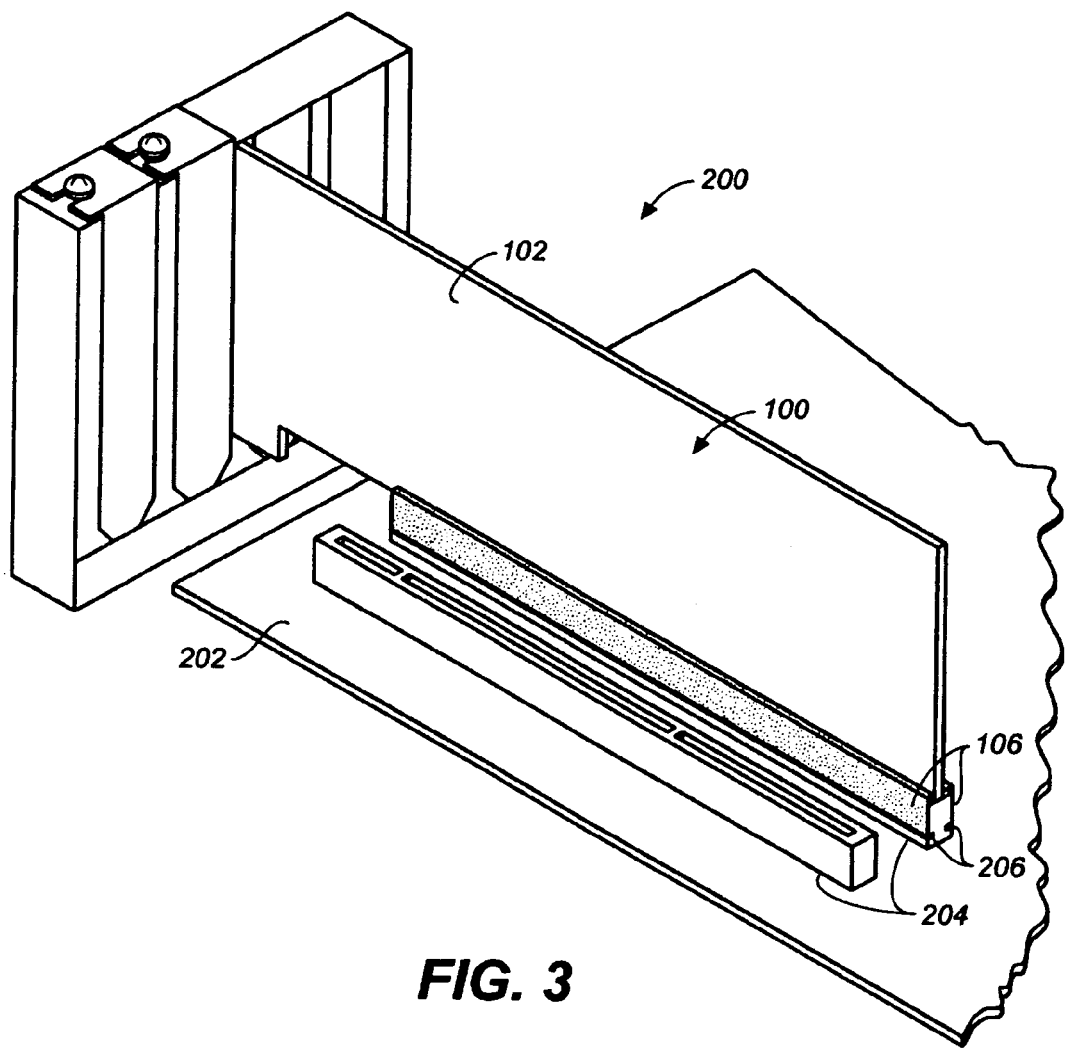
FIG. 3 is an isometric view of the computer system in FIG. 2, illustrating a device having a card edge lockshield coupled with a mating connector.

Then, in an attaching operation 504, attaching a card edge lockshield to a card connector first side and a card connector second side where the card edge lockshield includes a flexible plastic protective strip, the card edge lockshield includes a hard edge configured for coupling to a mating indentation disposed on a mating connector, and the card edge lockshield is disposed parallel to the card connector and extends beyond a card connector edge may occur. For example, as shown in FIGS. 1 through 3, card edge lockshield 106 may be attaching to a card connector first side and a card connector second side where the card edge lockshield is a flexible plastic protective strip, the card edge lockshield has a hard edge configured for coupling to a mating indentation disposed on a mating connector, and the card edge lockshield is disposed parallel to the card connector and extends beyond a card connector edge. Attaching operation 504 may be conducted in an automated fashion such as, for example, by an automated attacher module 404 (e.g. a robotic arm and/or automated production line configured to attach a card edge lockshield to a card connector first side and a card connector second side where the card edge lockshield includes a flexible plastic protective strip, the card edge lockshield has a hard edge configured for coupling to a mating indentation disposed on a mating connector, and the card edge lockshield is disposed parallel to the card connector and extends beyond a card connector edge) such as those commonly found in the manufacturing arts may be employed.

One advantage of device 100, computer system 200, and a method for providing the device 100 and computer system 200 may include protection for the card connector 104. When the card 102 is not coupled with a mating connector 204, card edge lockshield 106 may physically protect the card connector 104 and the conductive pads and/or the contact points disposed on the card connector 104. An additional advantage may include secure coupling of the device 100 with mating connector 204. A further advantage of the device 100, computer system 200, and method for providing the device 100 and computer system 200 may include electrostatic discharge shielding. A card edge lockshield 106 may electrically protect the card connector 104 and the conductive pads and/or the contact points disposed on the card connector 104 from potential electrostatic discharge into sensitive circuits.

An additional advantage of utilizing a card edge lockshield 106 may include a reduction in pressure and/or force applied to the device 100 and/or card 102 during installation of the card connector 104 into a mating connector 204. Often a card 102 may be installed by utilizing a fastener and/or clip on one end of the card 102 and exerting pressure on the end of the card 102 having the fastener and/or clip. Utilizing a card edge lockshield 106 may reduce the pressure applied to a single end of the card 102 and distribute the pressure more evenly over a whole side and/or edge of the card 102 during an installation resulting in less potential damage from excess localized pressure.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A device, comprising:
    a card including a card connector; and
    a card connector lockshield disposed on at least a card connector first side, the card connector lockshield including an electrostatic discharge shield, the card connector lockshield including a substantially flexible strip and a hard edge configured for coupling to a corresponding mating indentation groove disposed on a first side of a mating connector, the hard edge being oriented at about a 90 degree angle toward the card connector in relationship to the substantially flexible strip.

2. The device in claim 1, wherein a card connector lockshield disposed on at least a card connector first side comprises:
    a card connector lockshield extending from a card connector past a card connector edge.

3. The device in claim 1, further comprising side:
    a card connector lockshield surrounding a second side of the card connector.

4. The device in claim 1, wherein a card including a card connector comprises:
    an expansion card.

5. The device in claim 4, wherein a card including a card connector comprises:
    a RAID expansion card.

6. A computer system, comprising:
    a motherboard including at least one mating connector;
    at least one card including a card connector and a card connector lockshield disposed on at least a card connector first side, the card connector lockshield including an electrostatic discharge shield, the card connector lockshield including a substantially flexible strip and a hard edge configured for coupling to a corresponding mating indentation groove disposed on a mating connector first side, the hard edge being oriented at about a 90 degree angle toward the card connector in relationship to the substantially flexible strip.

7. The computer system in claim 6, wherein a motherboard including at least one mating connector comprises:
    a mating connector including at least one peripheral component interconnect.

8. The computer system in claim 6, wherein at least one card including a card connector and a card edge connector lockshield disposed on at least a card connector first side comprises:
    a RAID expansion card.

9. The computer system in claim 6, wherein at least one card including a card connector and a card connector lockshield disposed on at least a card connector first side comprises:
    a card connector lockshield extending from a card connector past a card connector edge.

10. The computer system in claim 6, further comprising:
    a card connector lockshield surrounding a second side of the card connector.

* * * * *